United States Patent [19]

Akagawa

[11] Patent Number: 4,902,186
[45] Date of Patent: Feb. 20, 1990

[54] DISK GUIDE FOR A DISK HANDLING SYSTEM

[75] Inventor: Minoru Akagawa, Fremont, Calif.
[73] Assignee: Intelmatec Corporation, Fremont, Calif.
[21] Appl. No.: 282,202
[22] Filed: Dec. 9, 1988
[51] Int. Cl.⁴ ............................................. B65B 21/02
[52] U.S. Cl. ..................................... 414/417; 414/757; 118/500
[58] Field of Search ............... 414/403, 419, 757, 331, 414/417; 118/500

[56] References Cited

U.S. PATENT DOCUMENTS

| | | | |
|---|---|---|---|
| 3,476,265 | 11/1969 | Powers | 414/417 X |
| 4,566,839 | 1/1986 | Butler | 414/417 X |
| 4,568,234 | 2/1986 | Lee et al. | 414/417 X |
| 4,597,819 | 7/1986 | Kusuhara et al. | 414/331 X |
| 4,611,966 | 9/1986 | Johnson | 414/417 X |
| 4,671,206 | 6/1987 | Hoppestad et al. | 118/500 X |

*Primary Examiner*—Robert J. Spar
*Assistant Examiner*—James R. Bidwell
*Attorney, Agent, or Firm*—Flehr, Hohbach, Test, Albritton & Herbert

[57] ABSTRACT

A disk guide is comprised of a pair of mutually parallel vertical grooves, a disk holder and a mechanism for moving the disk holder vertically. The grooves are formed on mutually opposite sidewalls such that a disk supported by the disk holder can be lifted vertically, supported and guided by the vertical grooves. The disk holder has a disk-supporting top surface which is sloped such that the disk supported thereon leans against a selected one of the vertical sidewalls and hence can be positioned accurately.

3 Claims, 1 Drawing Sheet

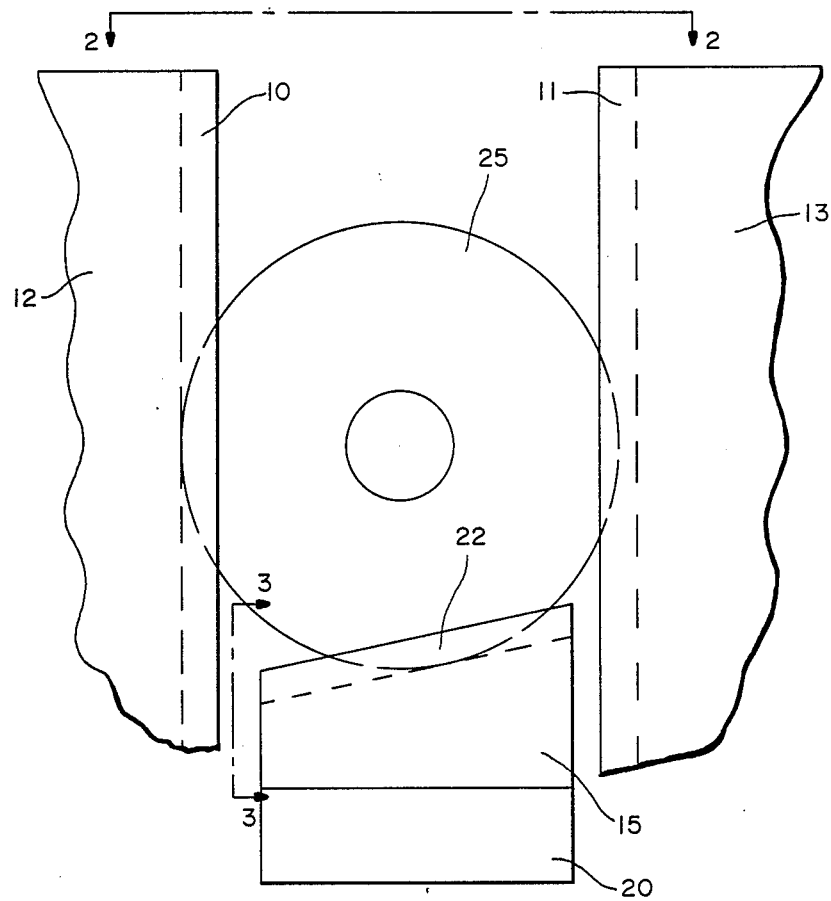
FIG.—1
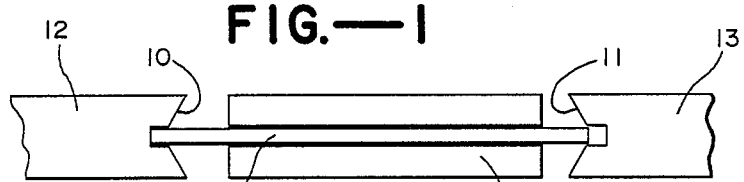
FIG.—2
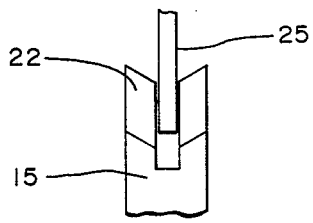
FIG.—3

DISK GUIDE FOR A DISK HANDLING SYSTEM

BACKGROUND OF THE INVENTION

This invention relates to a disk guide for a system for handling disks such as semiconductor wafers and more particularly to a disk guide for slidingly lifting such a disk supported from both sides by a pair of grooves. Semiconductor wafers are fragile or otherwise easy to be rendered useless by contamination or abrasion. Thus, automatic disk handling systems are commonly used to move such disks one at a time from one work station to another and from one processing position to another. For this reason, it is extremely important that each disk be brought accurately to a predetermined position such that an automated disk handling system can grasp it for moving it to a next position. As a part of such a disk handling system, it is common to provide a pair of vertically oriented grooves on mutually parallel vertical sidewalls which are opposite to each other and facing each other such that a disk can not only be vertically supported in these grooves by its peripheries but also slidably move vertically along these grooves. For such a purpose, a vertically mobile disk holder is usually provided not only to support the disk between these grooves from both sides but also to lift the disk upward to a predetermined height, and the separation between the grooves is made sufficiently larger than the diameter of the disk such that the disk can smoothly slide upward inside and along the grooves, but this has the undesirable consequence that the disk cannot be accurately positioned with respect to the grooves because the disk has the freedom of moving towards and leaning against either of the two grooves.

SUMMARY OF THE INVENTION

It is therefore an object of the present invention to provide a disk guide for a disk handling system whereby a disk such as a semiconductor wafer can be slidingly lifted between two parallel grooves to accurately assume a predetermined position.

The above and other objects of the present invention can be achieved by providing not only a pair of mutually parallel vertical grooves separated from each other such that a disk can smoothly move vertically therein and therealong but also a vertically mobile disk holder having a disk supporting top surface which slopes downward from one to the other of the two grooves such that the disk being supported and lifted thereby tends to always lean on and slide against one of the grooves and hence that the horizontal position of the disk when it has been lifted to a desired height is accurately determinable.

BRIEF DESCRIPTION OF THE DRAWINGS

The accompanying drawings, which are incorporated in and form a part of the specification, illustrate an embodiment of the present invention and, together with the description, serve to explain the principles of the invention. In the drawings:

FIG. 1 is a front view of a disk guide embodying the present invention,

FIG. 2 is a top view of the disk guide of FIG. 1 taken along the line 2—2, and

FIG. 3 is a side view of the disk holder of FIG. 1 taken along the line 3—3.

DETAILED DESCRIPTION OF THE INVENTION

As shown in FIGS. 1 and 2, a disk guide embodying the present invention for a disk handling system is comprised of a pair of mutually parallel vertical grooves 10 and 11 formed respectively on a pair of mutually opposite sidewalls 12 and 13, a disk holder 15 and a means for moving the disk holder 15 vertically which is symbolically illustrated at 20. The grooves 10 and 11 are shown to be generally V-shaped with mutually angled inner walls and an indentation at the apex of the V-shape but the exact sectional shape of the grooves 10 and 11 is not intended to limit the scope of the invention. Numeral 25 indicates a disk intended to be lifted accurately to a predetermined position by this disk guide and the pair of grooves 10 and 11 is so designed with respect to the disk 25 that the disk 25 does not fit too tightly in the grooves 10 and 11 when placed between the sidewalls 12 and 13. In other words, the grooves 10 and 11 are sufficiently deep, as shown in FIG. 2 more clearly, such that the disk 25 has some freedom to move towards either of the grooves 10 and 11 and can freely slide vertically along the grooves 10 and 11 without falling out thereof. The disk holder 15 has a disk-supporting top surface 22 which serves to support the disk 25 from below. This top surface 22 of the disk holder 15 is uniformly sloped downward, as best shown in FIG. 1, from one of the sidewalls 13 to the other 12 and is grooved in the direction of the aforementioned slope, as best shown in FIG. 3. The groove on the disk holder 15 may be of the same cross-sectional shape as the grooves 10 and 11 formed on the sidewalls 12 and 13 and serves to correctly position the edge of the disk 25 contacting the top surface 22. The slope of the top surface 22 is for the purpose of causing the disk 25 supported thereon to either slide or roll down to one side (left-hand side with reference to FIG. 1) and to lean against a specified one of the sidewalls (12). For this and other purposes, the slope of the top surface 22 of the disk holder 15 is preferably about 30° or less from the horizontal direction. With the disk guide thus structured, the disk 25 supported on the sloped disk-supporting top surface 22 of the disk holder 15 either slides or rolls downward by the gravitational force until its side peripheral edge comes to rest against the sidewall 12 on the left-hand side of FIG. 1. If the disk-holder 15 is thereafter moved vertically upward by the operation of the disk-moving means 20, the disk 25 moves upward accordingly, while remaining in contact with the groove 10 on the left-hand side sidewall 12. Since the grooves 10 and 11 are sufficiently deep, as explained above, the right-hand peripheral edge of the disk 25 is in contact with the groove 11 only to the extent that it is prevented from falling out. Thus, when the disk 25 is raised to a predetermined height, it is also leaning predictably against the left-hand groove 10 and hence its horizontal position is also accurately determined. The foregoing description of a preferred embodiment of the invention has been presented for purposes of illustration and description. It is not intended to be exhaustive or to limit the invention to the precise form disclosed, and many modifications and variations are possible in light of the above teaching. Any such modifications and variations that may be apparent to a person skilled in the art are intended to be included within the scope of this invention.

What is claimed is:

1. A disk guide for lifting a disk accurately to a predetermined position, said disk guide comprising
a pair of sidewalls having mutually parallel vertical U-shaped grooves which face each other and are separated from each other such that said disk can be supported thereby and can move vertically therealong,
a disk holder means having a disk-supporting top surface, said top surface being sloped so as to cause a disk supported thereon to lean against one of said vertical sidewalls and against the base portion of one of the said U-shaped grooves, and
lifting means for causing said disk holder means to move vertically.

2. The disk guide of claim 1 wherein said disk-supporting top surface is sloped by no more than 30° to the horizontal direction.

3. The disk guide of claim 1 wherein said disk-supporting top surface is grooved for accepting a disk therein.

* * * * *